United States Patent [19]

Wallstén et al.

[11] Patent Number: 5,176,938
[45] Date of Patent: Jan. 5, 1993

[54] PROCESS FOR SURFACE TREATMENT OF PULVERULENT MATERIAL

[75] Inventors: Hans I. Wallstén, Denens, Switzerland; Hirotsugu K. Yasuda, Columbia, Mo.

[73] Assignee: Plasmacarb Inc., Wilmington, Del.

[21] Appl. No.: 527,315

[22] Filed: May 23, 1990

Related U.S. Application Data

[63] Continuation-in-part of Ser. No. 274,775, Nov. 23, 1988, Pat. No. 4,948,485.

[51] Int. Cl.⁵ ............................................. B05D 1/08
[52] U.S. Cl. .................................. 427/447; 427/212; 427/215; 427/216; 427/220; 427/222; 75/10.19; 204/165; 204/168
[58] Field of Search ............... 427/34, 37, 38, 39, 427/40, 41, 212, 215, 216, 217, 220, 222; 204/164, 165, 168; 219/121.47, 121.51, 121.59; 75/10.19; 422/186.04, 906

[56] References Cited

U.S. PATENT DOCUMENTS

| | | | |
|---|---|---|---|
| 3,010,009 | 11/1961 | Ducati | 427/34 |
| 4,328,257 | 5/1982 | Muehlberger et al. | 427/34 |
| 4,596,718 | 6/1986 | Gruner | 427/34 |
| 4,670,290 | 6/1987 | Itoh et al. | 427/34 |
| 4,801,435 | 1/1989 | Tylko | 219/121.51 |
| 4,877,640 | 10/1989 | Muehlberger et al. | 427/34 |
| 4,901,921 | 2/1990 | Dallaire et al. | 219/121.47 |

Primary Examiner—Shrive Beck
Assistant Examiner—Terry J. Owens
Attorney, Agent, or Firm—Burns, Doane, Swecker & Mathis

[57] ABSTRACT

A process for the surface treatment of individual particles of a pulverulent material to improve the surface properties thereof. The process includes a plasma-generating apparatus for generating a plasma in a plasmagenerator while supplying an inert gas at a high drift velocity into the generator to form a low temperature plasma flame which is directed into a low pressure zone. Subsequently, the pulverulent material is injected into the high velocity inert gas or into the base of the plasma flame to disintegrate any particle aggregate present in the material. The low temperature plasma acts on the surface of each individual particle to improve the properties thereof. The treated particles can then be recovered from the zone.

14 Claims, 4 Drawing Sheets

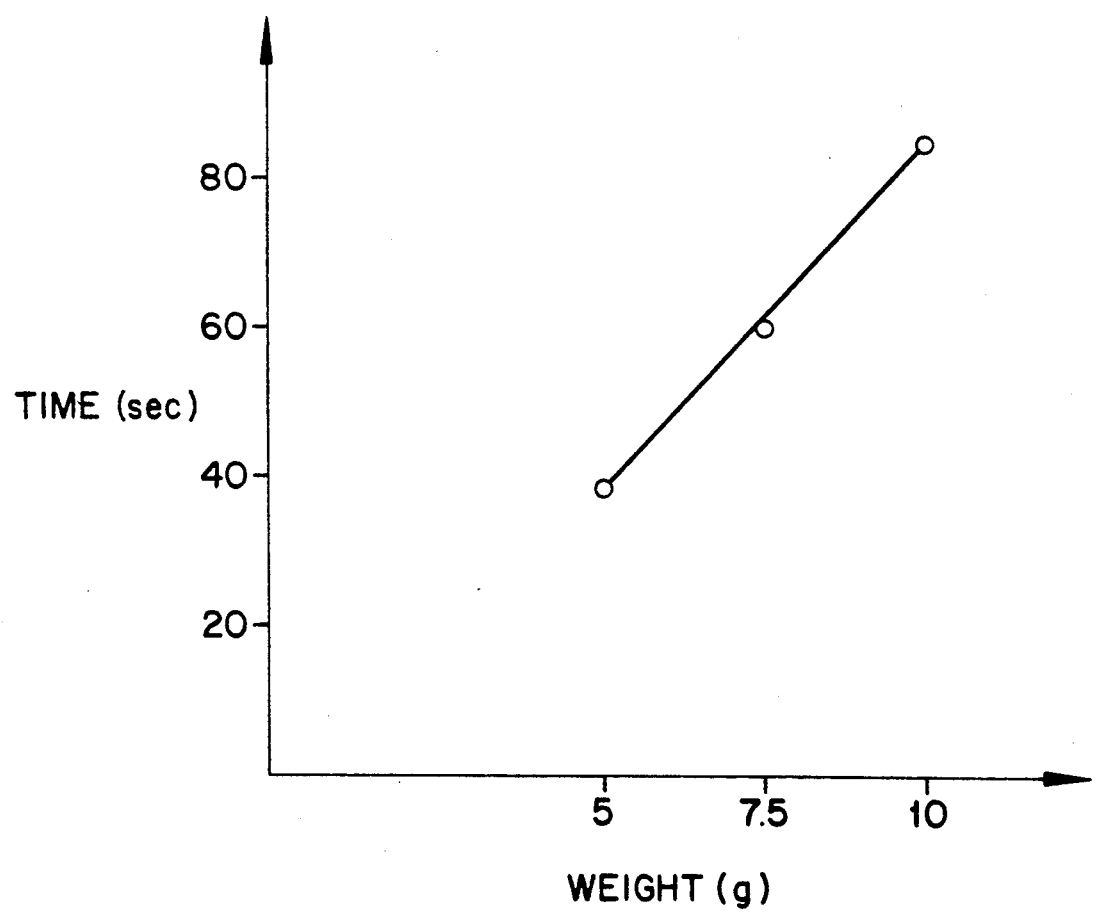

PROCESS FOR SURFACE TREATMENT OF PULVERULENT MATERIAL

REFERENCE TO RELATED APPLICATION

This application is a continuation-in-part of co-pending application Ser. No. 274,775, filed Nov. 23, 1988, now U.S. Pat. No. 4,948,485.

BACKGROUND AND SUMMARY OF THE INVENTION

The present invention relates to a process for the surface treatment of individual particles of a pulverulent material to improve the surface properties thereof. The invention also covers a plasma generating apparatus for use in such a process.

An important aspect in modern technology is constituted by the modification of the surface properties of different materials. Such modification can be obtained by for example treatment by the application of active species to the surface or by applying a coating to the surface. In recent years much attention has been directed to developing technologies enabling surface treatment of powders of different kinds. Particularly, the treatment of fine-sized pulverulent materials is subject to severe problems when trying to obtain uniform treatment of the surface of each individual particle to improve or modify the properties thereof.

One severe problem arising in connection with the surface treatment of pulverulent materials resides in the fact that the fine particles agglomerate to form clusters or aggregates, whereby the treatment will be inefficient and not reaching all exterior surfaces of the particles to be treated. Another problem resides in the fact that powders are difficult to handle in transportation due to dusting, irregularities in flow, fluidization, etc.

Different techniques have been developed for the purpose of improving the properties of powders of different kinds, and among such technologies there may be mentioned improvement in flow in iron or steel powder technology by admixing organic lubricants, and the treatment of organic pigments for the purpose of imparting a polarity to the surfaces of the particles thereof. Thus, U.S. Pat. No. 4,478,643 describes techniques for low temperature plasma treatment of organic pigments to obtain such polarity.

However, all technologies hitherto developed are subject to drawbacks, mainly due to the fact that they do not permit uniform modification of the surface properties of the particles treated mainly due to agglomeration phenomena. Moreover, the technologies devised up to now do not permit treatment of different types of powders and known techniques are specifically directed to the treatment of specific materials.

The present invention has for its main object to provide new techniques for the surface treatment of pulverulent materials.

Another object of the invention is to provide a process for the surface treatment of the individual particles of a pulverulent material to improve the surface properties thereof.

Another object of the invention is to provide techniques using a low temperature plasma flame in the treatment of the individual particles of a pulverulent material.

Yet another object of the invention is to provide techniques enabling efficient surface treatment of powder particles irrespective of the material on which said powder is based.

The present invention is based on the surprising discovery that if the pulverulent material to be treated is injected into an inert gas used for generating the low temperature plasma flame efficient disintegration of any agglomerated particles present in the material will be obtained if the inert gas is travelling at a high velocity when contacted by the pulverulent material. High disintegrating efficiency will be obtained if the inert gas travels at a high drift velocity and uniform surface treatment will be obtained by using such techniques.

Accordingly, the present invention provides a process for the surface treatment of individual particles of a pulverulent material to improve the surface properties thereof. The process is comprised by the following steps:

a) generating a plasma in a plasmagenerator while supplying an inert gas at a high velocity into said generator to form a low temperature plasma flame which is directed into a low pressure zone;

b) injecting the pulverulent material into said high velocity inert gas or into the base of said plasma flame to disintegrate any particle aggregate present in said material;

c) allowing the low temperature plasma to act on the surface of each individual particle to improve the properties thereof; and d) recovering the treated particles from said zone.

According to one aspect of the invention, powders can be treated for modifying the surface properties thereof by treatment with non-polymer forming gases, such as ammonia, oxygen, water vapor, etc.

According to a particularly preferred embodiment of the process of the present invention the surface treatment involves the formation of a uniform surface coating on each individual particle using plasma polymerization. In obtaining such coating step b) above is accompanied by the step of injecting a monomeric gas into the inert gas at a first location upstream of the plasma flame. Such monomeric gas may be constituted by one or more monomers.

As indicated above, efficient and uniform surface treatment of the individual particles of the pulverulent material will be obtained if the drift velocity of the inert gas used to form a low temperature plasma flame is high and exceeds about 100 m/sec. Thus, it is preferred that the inert gas drift velocity is higher than about 100 m/sec., such as higher than about 200 m/sec. and especially higher than about 300 m/sec. Drift velocity is calculated according to the formula:

$$\frac{F}{A \cdot P}.$$

where F is the flow rate of the gas, A is the cross-section of the flow passage and P is the pressure. It can be seen from said formula that the lower the pressure, the higher the velocity.

Although the process can be performed using any type of low temperature plasma generator a preferred type of generator is a so called cascade arc plasma torch generator. For details concerning such apparatus reference is made to co-pending U.S. patent application Ser. No. 274,775, the disclosure of which is incorporated herein by reference.

When using plasma polymerization to form a uniform surface coating on each individual particle it is preferred to supply the pulverulent material at a location which is downstream of the location at which the monomeric gas is supplied. According to another aspect of the invention the pulverulent material may be entrained in the monomeric gas supplied or in a part thereof.

As indicated earlier in this disclosure the process of the present invention is unique in that it allows efficient surface treatment of the individual particles of a pulverulent material irrespective of the material subject to treatment. Thus, the pulverulent material may be constituted by metal or metal alloy powders, metal compound powders, organic powders or ceramic powders. Particularly interesting materials are iron or steel powders used in metal powder technology, and metal oxides. Another interesting group of materials are organic or inorganic pigments. A third group of materials are metal oxides, such as titanium oxide or zirconium oxide, where titanium oxide is of interest when used dispersed in polymeric materials to allow for determination of location using X-ray techniques. A further group is constituted by hard metals, such as tungsten and titanium carbides. Further materials are aluminum powders, aluminum hydrate powders used for flame retardation for dispersion in polymers. $SiO_2$ for example used as a filler, etc.

The monomeric gas used if plasma polymerization is applied may be constituted by hydrocarbons and halogenated hydrocarbons, silanes, organosilanes and organometallic compounds, optionally together with hydrogen, $H_2O$ or chemically reactive gases. Examples of organometallic compounds are tetramethyl tin and diethyl zinc. For details concerning such monomeric gas reference is made to the above-mentioned co-pending U.S. patent application.

The invention also covers a plasma-generating apparatus for use in the low temperature plasma treatment of the surface of the individual particles of pulverulent materials. Such apparatus comprises means for generating a vacuum zone and, in association therewith, a plasma generator having a central passage therethrough opening into said vacuum zone. The apparatus includes means for introducing an inert gas into said passage and is characterized by powder inlet means for introducing a pulverulent material to be treated into said passage and by discharge means for removing treated material from the vacuum zone. To maintain an efficient vacuum in the vacuum zone it is preferred that the discharge means are designed as lock means for intermittent discharge of treated pulverulent material.

In accordance with a preferred aspect of the invention the plasma-generating apparatus further comprises inlet means located upstream of the powder inlet means for introducing monomeric gas enabling plasma polymerization for the purpose of forming a uniform surface coating on each individual particle in the vacuum zone.

BRIEF DESCRIPTION OF THE DRAWINGS

The present invention will be further illustrated below by specific examples with reference to the appended drawings. In the drawing:

FIG. 5 shows a diagram on flow characteristics of coated iron powder.

DETAILED DESCRIPTION OF A PREFERRED EMBODIMENT OF THE INVENTION

Figure 1:
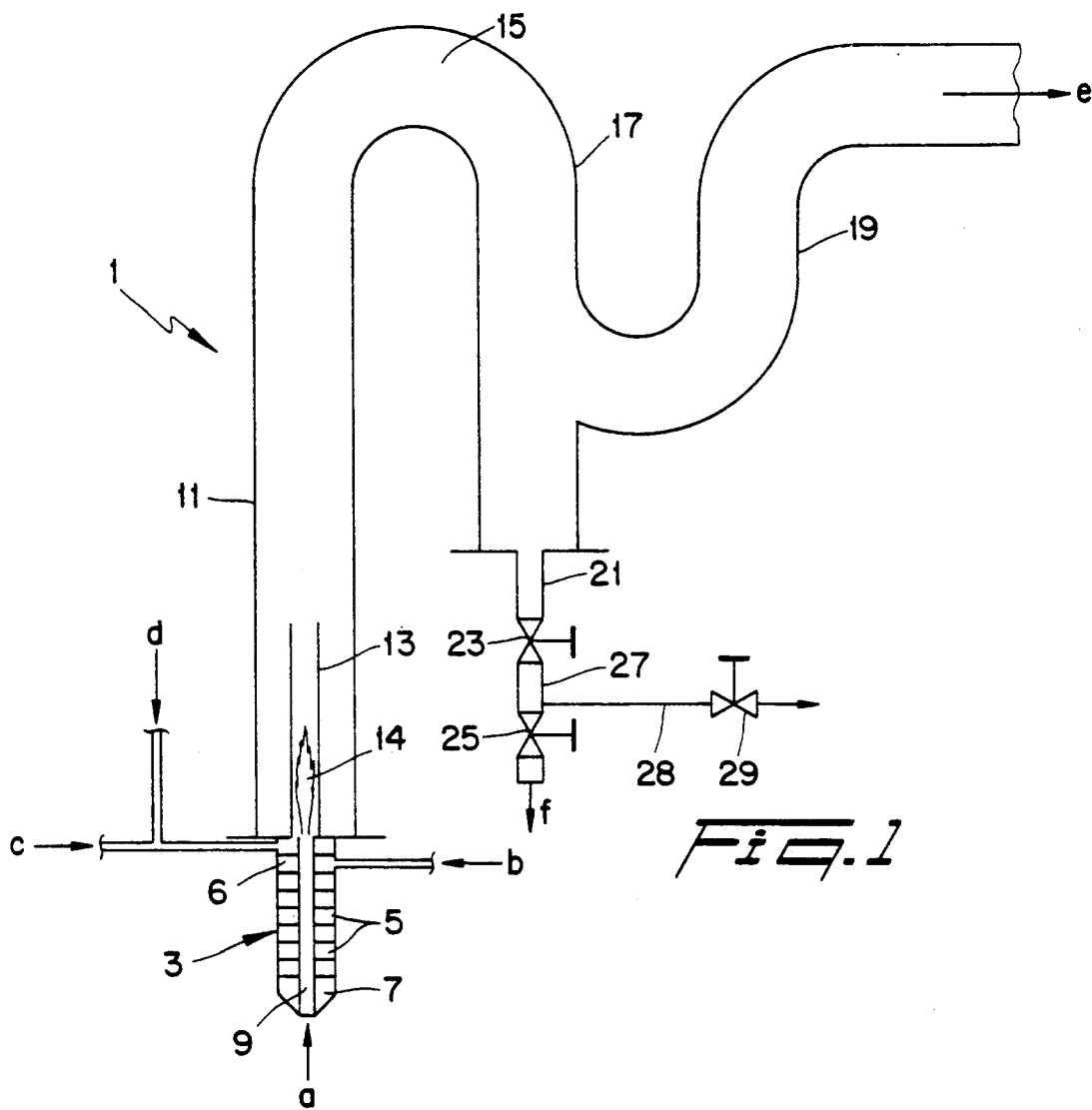
FIG. 1 shows a plasma-generating apparatus using a vertical setup.

The plasma-generating apparatus shown in FIG. 1 and generally designated 1 is of the so-called cascade arc reactor type creating a plasma torch, wherein the powder is subjected to treatment or a coating.

The plasma-generating apparatus 1 contains a cascade arc reactor generally designated 3 which is built up from a series of concentric metallic rings 5 separated by insulator rings not shown. The metallic rings 3 float electrically between an anode ring 6 and a cathode 7, and the energy supply may be a relatively low DC voltage supply connected between cathode 7 and anode ring 6. A suitable voltage lies within the range about 50 to 200 volts. The system of metallic rings 5 and insulator rings form a central passage 9, and in the downstream extension of said section 9 a plasma torch 14 will be formed under operation.

Argon is injected into the central passage 9 at the cathode 7 as indicated by arrow a and provides a high gas flux into the vacuum at the outlet of the reactor 3. Monomeric gas is injected into the downstream end of central passage 9 as indicated at arrow b, and also at a location indicated with arrow c, wherein part of the monomeric gas is used for introducing powder to be treated into central passage 9. The location for the introduction of such powder is indicated by arrow d. The monomeric gas can also be injected into a middle section of the central passage, which is halfway downstream from the cathode. FIG. 1A. The powders can be injected into the middle section of the central passage. The sequence of monomer and powder can be reversed. Both monomeric gas and powder can be injected into the inner tube directly at a location 3–5 cm away from the downstream end of the central passage.

Plasma generating apparatus 1 further comprises an upwardly extending outer tube 11 aligned with central passage 9 and having a centre axis aligned with that of central passage 9. At the upper end the outer tube 11 extends into a 180° bend 15 passing over into a downwardly extending vertical position 17 of the tube. At a distance from the lower end of said vertical section 17 there is a branched side section 19 attached to a vacuum pump (not shown), the vacuum being created at arrow e.

At the lower end of the vertical section 17 a discharge tube 21 is arranged for the discharge of treated powder. Said discharge tube 21 contains two axially spaced valves 23, 25 defining between same an intermediate space 27 for a purpose to be described further below. The treated powder will be discharged as indicated by arrow f. If desired, treated powder can be recirculated to the process (at arrow d) by discharge from space 27 via conduit 28 and associated valve 29.

The coated powders collected in the intermediate space can be repeatedly treated after they are directed to the powder feeder by valve 29. The coated powder can also be coated with a different monomer if delivered to a different reactor system, where another monomeric gas is injected.

The relevant dimensions of the set-up disclosed in FIG. 1 are as follows. The vertical part of the outer tube 11 has an inner diameter of about 15 cm and a vertical extension of about 125 cm. The inner diameter of inner tube 13 is about 5 cm and its vertical extension about 30 to 40 cm. The central passage 9 has a diameter of about 2 mm. The inner tube is placed to prevent a quick expansion of arc flame and also to prevent the coated powders to expand quickly. The tube also prevents the gas to create a scattered and circulating flow at the end of the central passage. The inner tube maintains an open central passage.

Vacuum is created in the system using a 2-stage vacuum pump and the electrical power is delivered from a DC power supply, energy within the range about 300 to 2000 watts being applied.

Figure 2:
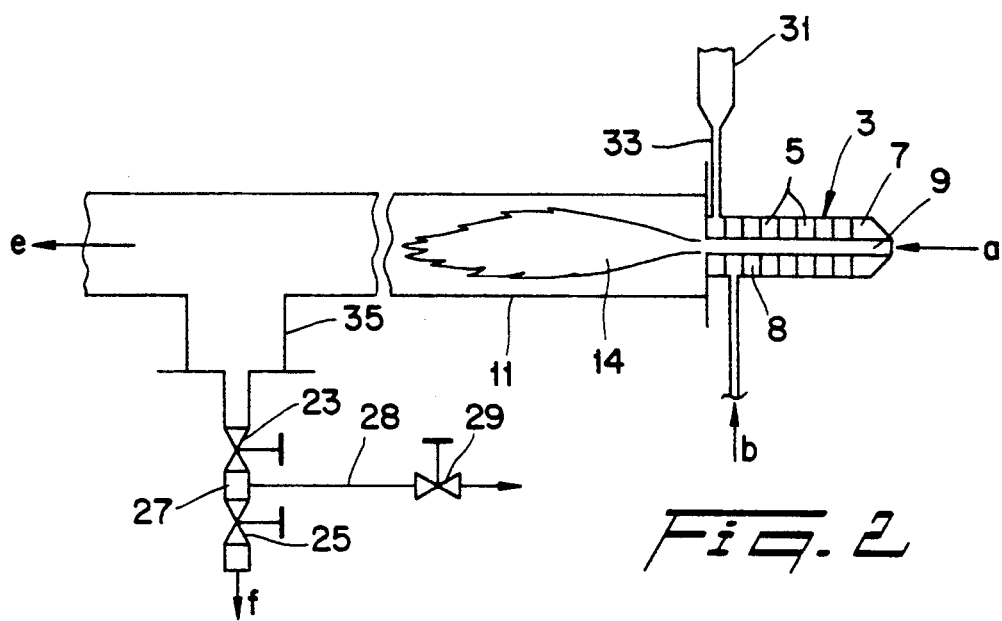
FIG. 2 shows another embodiment of plasma-generating apparatus using a horizontal setup, the pulverulent material being supplied by gravity.

The embodiment shown in FIG. 2 operates largely along the same principles, but uses horizontal set-up. Corresponding details in the apparatus shown in FIG. 2 are designated with corresponding reference numerals as those of FIG. 1.

In the apparatus shown in FIG. 2 the powder to be coated is supplied from a powder funnel 31 connected to the central passage by an inlet tube 33. The apparatus of FIG. 2 operates without an inner tube and the powder is removed through a discharge tube 35 connected to a corresponding valve arrangement as that described in connection with FIG. 1.

Plasma generating apparatus 1 illustrated in FIG. 1 functions briefly as follows.

Figure 4:
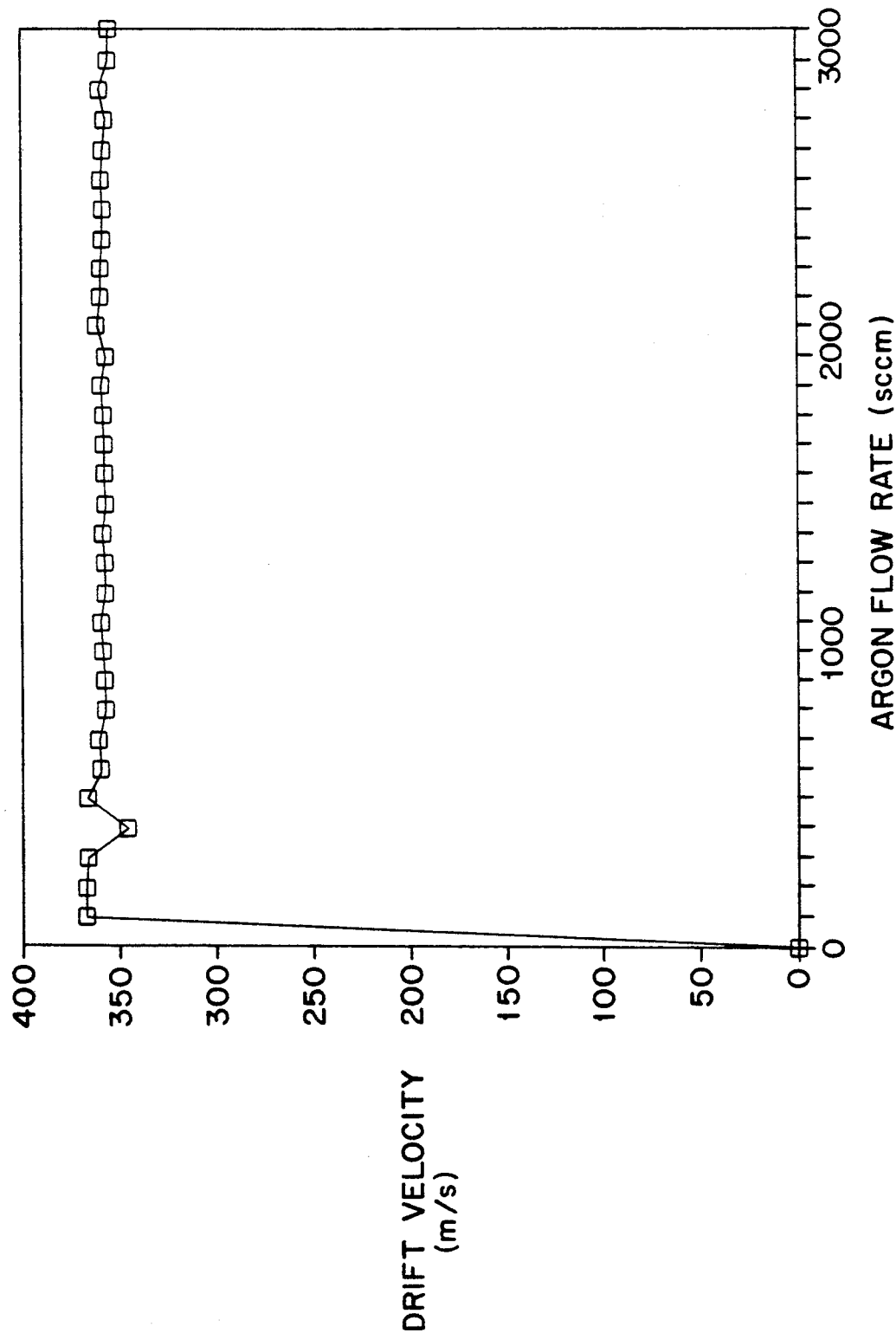
FIG. 4 shows a diagram on drift velocity versus flow rate.

Prior to starting the powder treatment the system is pumped down to a vacuum of for example about 11 torr. Argon gas is injected at a flow rate of about 2000 sccm (standard cubic centimeters), and methane as a monomeric gas is supplied at locations indicated by arrows b and c. At arrow c part of the methane gas is used for entraining the powder to be treated and supplied at arrow d. When reaching the central passage 9 the powder is confronted with the argon gas travelling below, about 360 m per sec. (FIG. 4). Thus, when entering the base of torch 14 created within the inner tube 13 any aggregates of particles will have been disintegrated by the flow or argon gas and in the plasma zone therefore each and every discreet particles will be uniformly coated by plasma polymerization.

After leaving the inner tube the treated particles proceed further upwardly through the outer tube 11 and into the bend 15 and move further down the vertical section 17 of the tube where due to gravity the treated particles proceed further into the discharge tube 21.

As a preparation for the discharge of the treated powder the intermediate space 27 will be set under a vacuum largely corresponding to that prevailing inside tube 11 During this operation both valves 23, 25 are in a closed position. After generating a vacuum in intermediate space 27 valve 23 is opened and the powder then enters space 27 by gravity. Valve 23 is then closed and valve 25 opened, whereby the treated powder will be discharged at arrow f for further use.

The apparatus shown in FIG. 1 thus operates efficiently in a continuous manner, and in practical operation it has been found that large scale operation can be performed and powders of different kinds coated at a relatively low cost. This invention has made large scale operation possible for the first time while keeping the cost at a reasonable level.

The embodiment shown in FIG. 2 operates essentially in the same manner as the embodiment of FIG. 1.

The invention will now be further described by specific examples illustrating treatment of different types of powders.

EXAMPLE 1

Coating of Iron Powder

Figure 3:
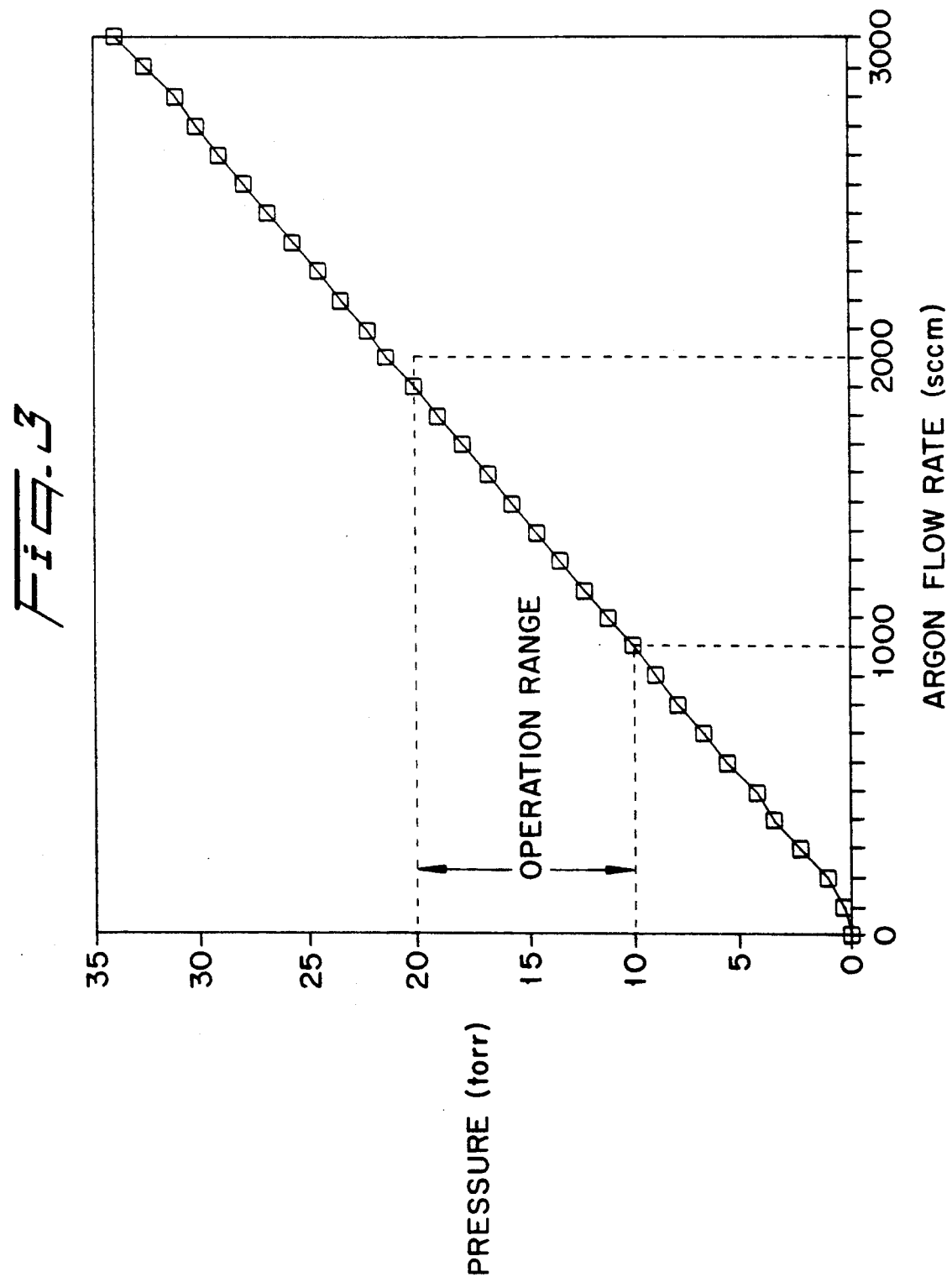
FIG. 3 shows a diagram on pressure or argon versus flow rate.

The apparatus described in connection with FIG. 1 was used in the experiment and the iron powder coated was a commercial iron powder having a particle size of the order of about 100 microns. The apparatus was operated within the operation range shown in FIG. 3, which is a diagram on pressure of argon versus flow rate. As can be seen from the diagram of FIG. 3 the inert gas flow rate varied between about 1000 and 2000 m per sec. corresponding to a pressure of between about 10 to 20 torr. This velocity results in efficient disintegration of any aggregates of particles in the powder supplied.

The monomeric gas used for the plasma polymerization coating was methane, and the methane was supplied at a flow rate of about 200 sccm.

In reaching the plasma torch region within inner tube 13 the iron powder particles were efficiently coated by plasma polymerization to improve the properties of the powder, and the treated particles were discharged at the location of arrow f.

The flow characteristics of the treated iron powder were tested by recording the flow through a 0.5 mm capillary. The coated powder was used in quantities of 5, 7.5 and 10 g. FIG. 5 shows a diagram on flow-through time in seconds versus weight. When testing the flow characteristics of untreated iron powder it was noted that such untreated powder did not pass the capillary at all but rather clogged it up.

The results of the flow test on treated iron powder clearly show the improvement in flow characteristics obtained by applying the techniques of the present invention.

EXAMPLE 2

Coating of Aluminum Trihydrate

In this example, aluminum trihydrate particles having a particle size of about 1 micron and a density of 2.42 g per $cm^3$ were coated by plasma polymerization using the procedure outlined above and in Example 1. The coated aluminum trihydrate particles were tested for change in surface properties by immersing treated and untreated powder in a beaker filled with hexane. After repeated stirring of the contents of the beaker it is seen that the coated powder disperses in the medium, whereas the untreated powder remains in a bulk. When the settling time for the dispersed treated powder is measured a settling time of about 180 sec. was noted for the coated powder. The untreated powder almost did not disperse at all thus resulting in a very short settling time. Moreover, it was established by DSC (Differential Scanning Calorimetry) that the coated powder had not lost its water of hydration.

EXAMPLE 3

Coating of Titanium Oxide

The procedure of Example 1 was repeated but the powder used as titanium oxide, $TiO_2$, having a particle size of the order of about 1 micron. As in Example 2, the coated titanium oxide particles had substantially improved dispersion characteristics as compared to the untreated powder particles.

EXAMPLE 4

Coating of Zirconium Oxide

Example 1 was repeated but using a zirconium oxide powder with particles having a particle size of the order of about 1 micron. As with titanium oxide of Example 3 the coated zirconium particles dispersed well in hexane. whereas untreated powder particles largely remained in bulk.

EXAMPLE 5

Coating of Silicon Oxide

Example 1 was repeated but using a silicon oxide powder with particles having a particle size of about 1 micron. The coated powder formed a suspension when mixed with hexane, but the uncoated powder remained in bulk at the bottom of the beaker.

The principles. preferred embodiments and modes of operation of the present invention have been described in the foregoing application. The invention which is intended to be protected herein should not, however, be construed as limited to the particular forms disclosed, as these are to be regarded as illustrative rather than restrictive. Variations and changes may be made by those skilled in the art without departing from the spirit of the present invention. Accordingly, the foregoing detailed description should be considered exemplary in nature and not limited to the scope and spirit of the invention as set forth in the appended claims.

What is claimed is:

1. A process for the surface treatment of individual particles of a pulverulent material for improving surface properties thereof. comprising the steps of:
   a) generating a plasma in a plasmagenerator while supplying an inert gas into said generator to form a plasma flame which is directed into a zone:
   b) injecting the pulverulent material into one of said inert gas and a base of said plasma flame to disintegrate any particle aggregate present in said pulverulent material;
   c) injecting a monomeric gas into the inert gas at a first location upstream of said plasma flame, thereby allowing plasma polymerization to form a surface coating on each individual particle;
   d) allowing the plasma flame to act on the surface of each individual particle: and
   e) recovering the individual particles from said zone.

2. A process according to claim 1. wherein the inert gas has a drift velocity that is higher than about 100 m/sec.

3. A process according to claim 1. wherein the inert gas has a drift velocity that is higher than about 200 m/sec.

4. A process according to claim 1, wherein the plasmagenerator is a cascade arc plasma torch generator.

5. A process according to claim 1, wherein the pulverulent material is introduced into the inert gas at a second location downstream of said first location.

6. A process according to claim 1, wherein the pulverulent material is selected from the group consisting of metal and metal alloy powders, metal compound powders, organic material powders and ceramic powders.

7. A process according to claim 6. wherein said metal alloy powder is an iron powder.

8. A process according to claim 6. wherein said pulverulent material is a metal oxide.

9. A process according to claim 1. wherein said monomeric gas contains at least one monomer selected from the group consisting of hydrocarbons and halogenated hydrocarbons. silanes. organosilanes and organometallic compounds.

10. a process according to claim 9. wherein a member of said group is combined with hydrogen.

11. A process according to claim 1, wherein the zone has a pressure that is less than about 100 Torr.

12. A process according to claim 5, wherein said monomeric gas contains at least one monomer selected from the group consisting of hydrocarbons and halogenated hydrocarbons, silanes, organosilanes and organometallic compounds.

13. The process according to claim 1, wherein:
   the inert gas is supplied at a drift velocity that is greater than 100 m/sec: and
   the zone has a pressure that is less than about 100 Torr.

14. The process according to claim 1, wherein the plasma polymerization forms a uniform surface coating on each individual particle.

* * * * *